(12) United States Patent
Kim

(10) Patent No.: US 9,041,255 B2
(45) Date of Patent: May 26, 2015

(54) HIGH CAPACITY ELECTRONIC SWITCH

(76) Inventor: Moon J. Kim, Wappingers, NY (US)

(*) Notice: Subject to any disclaimer, the term of this patent is extended or adjusted under 35 U.S.C. 154(b) by 690 days.

(21) Appl. No.: 13/188,632

(22) Filed: Jul. 22, 2011

(65) Prior Publication Data

US 2013/0021086 A1    Jan. 24, 2013

(51) Int. Cl.
G01R 19/00 (2006.01)
H01L 29/02 (2006.01)

(52) U.S. Cl.
CPC ............ G01R 19/0092 (2013.01); H01L 29/02 (2013.01)

(58) Field of Classification Search
CPC .................................................. G01R 19/0092
USPC .......................................................... 307/112
See application file for complete search history.

(56) References Cited

U.S. PATENT DOCUMENTS

| | | | |
|---|---|---|---|
| 6,464,356 B1 * | 10/2002 | Sabel et al. | 351/203 |
| 7,468,669 B1 | 12/2008 | Beck et al. | |
| 7,547,150 B2 | 6/2009 | Downie et al. | |
| 8,273,610 B2 * | 9/2012 | Or-Bach et al. | 438/142 |
| 2009/0040029 A1 | 2/2009 | Bridges et al. | |
| 2010/0098425 A1 | 4/2010 | Kewitsch | |
| 2012/0055702 A1 * | 3/2012 | Rathburn | 174/254 |
| 2013/0200435 A1 * | 8/2013 | Chu et al. | 257/194 |

OTHER PUBLICATIONS

Salleo, Alberto. Flexible electronics: materials and applications. Ed. William S. Wong. vol. 24. New York: Springer, 2009.*
"ACD-4 Digital Clamp Meter", AMPROBE Test Tools, 2010, 2 pages. No author cited. www.Amprobe.com.
Lee, Y. Ph.D., "Antenna Circuit Design for RFID Applications", Microchip Technology Inc. (2003), 50 pages.
"Kill A Watt", P3 International Corporation (2010), 1 page. No author cited. http://www.p3international.com/products/special/P4400-CE.html.
"Tag Tuning", ATMEL corporation (2002). 7 pages. Rev. 2055A-RFID-07/02. No author cited.

* cited by examiner

*Primary Examiner* — Daniel Cavallari
(74) *Attorney, Agent, or Firm* — Hunter E. Webb; Keohane & D'Alessandro, PLLC

(57) ABSTRACT

Embodiments of the present invention provide an electronic switch for commodity use. Specifically, embodiments of this invention provide a high capacity intelligent electronic switch for commodity use. A flexible film substrate is used along with a field-effect transistor (FET) to produce a commodity switch. Multiple printed flexible electronics PFE substrates are stacked to and integrated into an electronic switch system. Various methods are used to measure power consumption within the switch. The modular cell design allows for horizontal and vertical scaling.

12 Claims, 16 Drawing Sheets

HIGH CAPACITY ELECTRONIC SWITCH

FIELD OF THE INVENTION

The present invention relates to electronic switches. In particular, the present invention is directed to an efficient, high capacity intelligent electronic switch for commodity use.

BACKGROUND OF THE INVENTION

Electrical switches are controls consisting of a mechanical, electrical, or electronic device for making, breaking, or changing the connections in a circuit. Switches are commonly used in most modern electrical and electronic devices to selectively place electrical or other signals onto desired signal paths. Electromechanical switches in particular are often found in medical, industrial, and consumer electronics, as well as other settings.

However, conventional electromechanical switches are not suitable for smart grid technology. The conventional electromechanical switch has a limited lifespan, is bulky in size, inflexible, and difficult to scale up and down. Moreover, it is expensive for commodity use.

U.S. Pat. No. 7,547,150 discloses an optical fiber cable housing with an integrated transducer and RFID element.

U.S. Pat. No. 7,468,669 discloses a method for identifying interconnect cables.

U.S. Patent Application 20100098425 discloses the use of a RFID overlay network with a fiber optic network for automating the discovery and configuration management of the physical fiber optic connections with a communications network.

U.S. Patent Application 20090040029 discloses a method for utilizing power storage devices to allow for non-peak demand electrical grid power to be stored and then resupplied back to the grid during peak demand times to reduce the peak demand power required from electrical generation facilities.

SUMMARY OF THE INVENTION

Conceptually, an electronic switch can be visualized as a group of one or more mechanical electrical switches (such as light switches used in commercial wiring or toggle switches used in many electronic control panels) in which, instead of mechanically opening or closing the contacts, the physical opening and closing is achieved by applying appropriate electrical control signals to separate terminals on the switch in much the same way that a relay performs. The electronic switch does not contain mechanical contacts, but contains semiconductor devices such as bipolar junction transistors or field-effect transistors.

Electronic switches can be very small, allowing a large number of these devices to be placed in a small area. They can be very fast, with on and off response times which are orders of magnitude faster than can be achieved with mechanical counterparts, and they are considerably more reliable over a large number of cycles than their mechanical counterparts. Conventional solid-state switches are too dense to dissipate any heat that it is not area efficient.

Embodiments of the present invention provide an electronic switch for commodity use. Specifically, embodiments of the present invention provide a high capacity intelligent electronic switch for commodity use. A flexible film substrate is used along with a field-effect transistor (FET) to produce a commodity switch. Multiple printed flexible electronics (PFE) substrates are stacked and integrated into an electronic switch system. Various methods are used to measure power consumption within the switch. The modular cell design allows for horizontal and vertical scaling. The ability to scale lends the switches to use in smart grid applications. The bulk volume of the PFE switch array is more favorable to heat dissipation than solid-state switch technology.

A first aspect of the present invention provides a stackable electronic switch cell, comprising: a flexible film substrate positioned to allow current flow in controlled directions and a field-effect transistor (FET).

A second aspect of the present invention provides an electronic switch system comprising a plurality of stackable electronic switch cells, each electronic switch cell comprising: a flexible film substrate positioned to allow current flow in controlled directions and a field-effect transistor (FET).

A third aspect of the present invention provides a method for providing an electronic switch system comprising a plurality of stackable electronic switch cells, each electronic switch cell comprising: a flexible film substrate positioned to allow current flow in controlled directions and a field-effect transistor (FET).

BRIEF DESCRIPTION OF THE DRAWINGS

These and other features of this invention will be more readily understood from the following detailed description of the various aspects of the invention taken in conjunction with the accompanying drawings in which.

Figure 1C:
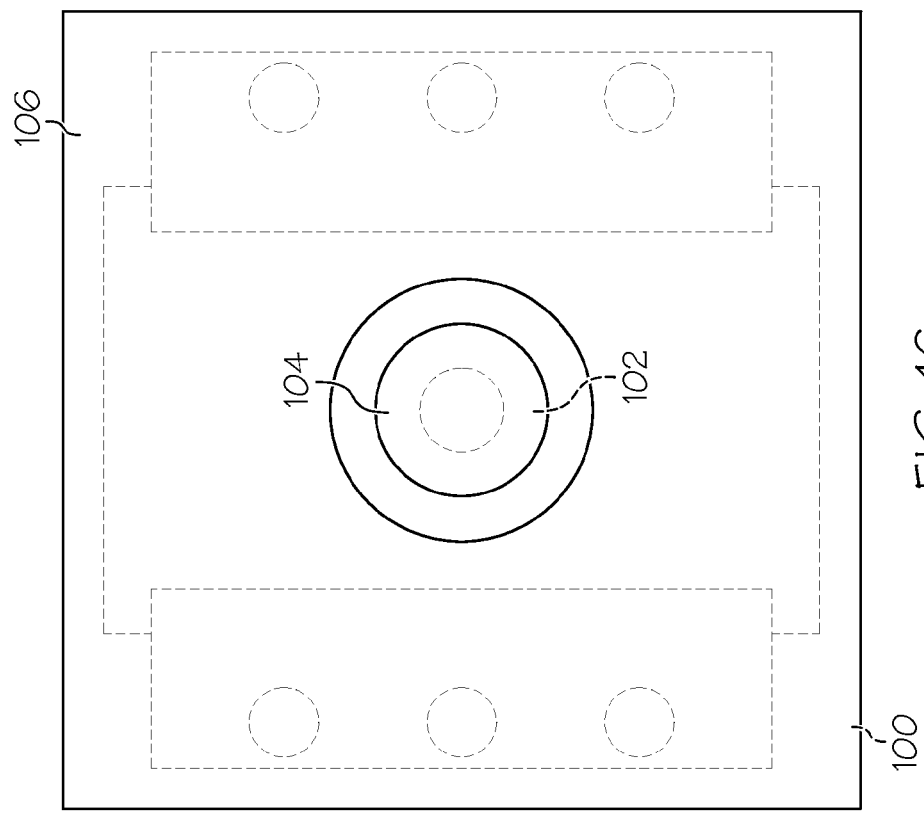
FIGS. 1A-C are diagrams schematically illustrating three separate perspectives of a flexible switch cell.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Exemplary embodiments will now be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms such as those defined in commonly used dictionaries should be interpreted as having a meaning that is consistent with their meaning in the context of the relevant art and the present disclosure, and will not be interpreted in an idealized or overly formal sense unless expressly so defined herein.

Embodiments of the present invention provide an electronic switch for commodity use. Specifically, embodiments of the present invention provide a high capacity intelligent electronic switch for commodity use. A flexible film substrate is used along with a field-effect transistor (FET) to produce a commodity switch. Multiple printed flexible electronics (PFE) substrates are stacked and integrated into an electronic switch system. Various methods are used to measure power consumption within the switch. The modular cell design allows for horizontal and vertical scaling. The ability to scale lends the switches to use in relatively high-power smart grid applications.

Figure 1A:
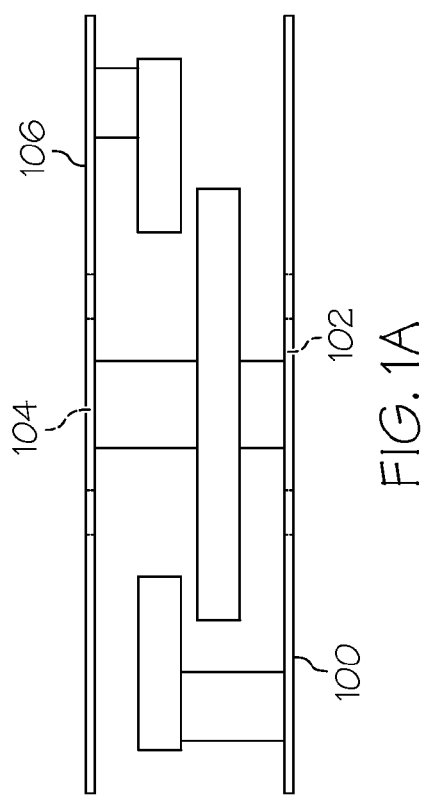
Figure 1B:
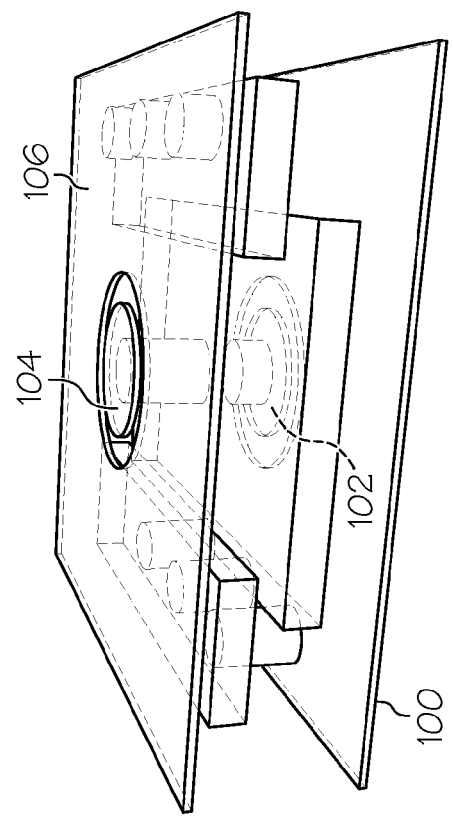

FIGS. 1A-C are diagrams schematically illustrating three distinct perspectives of a flexible switch cell. Four components of the flexible switch cell are highlighted, with each of the four components being shown in each distinct perspective. Each flexible switch cell includes a flexible film substrate having bottom plate 100, bottom control 102, top plate 106, and top control 104. The modular cell design allows for horizontal and vertical scaling. The flexibility in scaling allows for applying the design to either 110V or 240V by changing horizontal and vertical stacking parameters. The commodity switch cell includes a flexible film substrate and field-effect transistor (FET). A printed flexible electronics (PFE) film is applied to the substrate. The field-effect transistor (FET) controls the current between two points but does so differently than the bipolar transistor. The FET operates by the effects of an electric field on the flow of electrons through a single type of semiconductor material. The FET is sometimes called a unipolar transistor. The FET controls the current between two points.

The FET operates by the effects of an electric field on the flow of electrons through the substrate. All FETs have a gate, drain, and source terminal. The names of the terminals refer to their functions. The gate terminal may be thought of as controlling the opening and closing of a physical gate. This gate permits electrons to flow through or blocks their passage by creating or eliminating a channel between the source and drain. Electrons flow from the source terminal towards the drain terminal if influenced by an applied voltage. The body simply refers to the bulk of the semiconductor in which the gate, source, and drain lie. Usually the body terminal is connected to the highest or lowest voltage within the circuit, depending on type. The body terminal and the source terminal are sometimes connected together since the source is also sometimes connected to the highest or lowest voltage within the circuit.

Figure 2A:
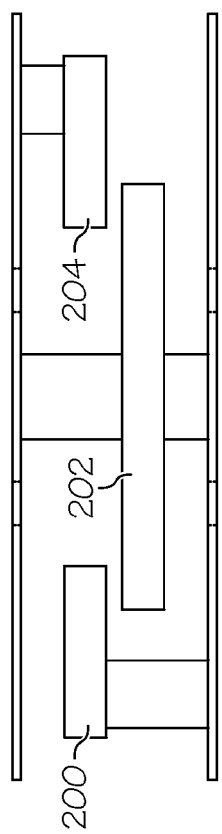
FIGS. 2A-C are another set of diagrams schematically illustrating three separate perspectives of a flexible switch cell.
Figure 2B:
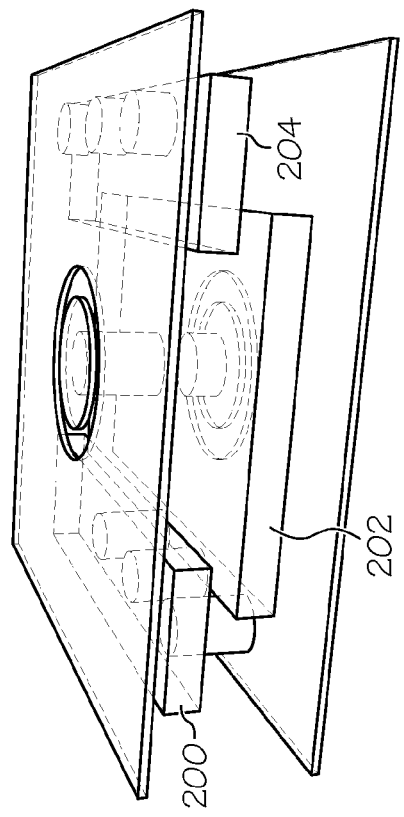
Figure 2C:
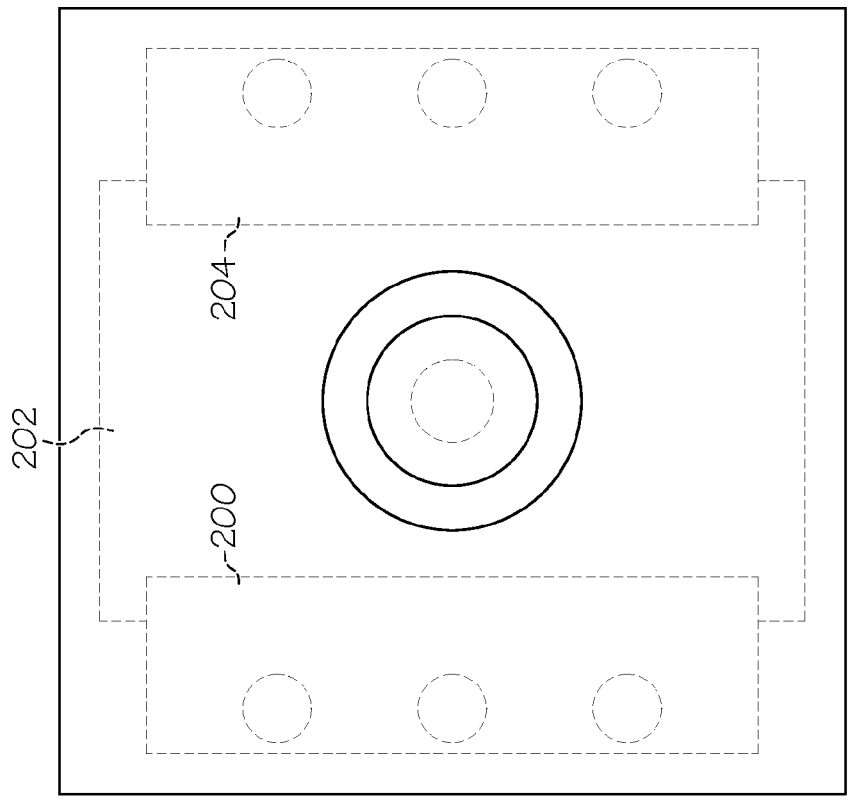

FIGS. 2A-C are another set of diagrams schematically illustrating three distinct perspectives of a flexible switch cell. The diagram depicts the following components: source connection 200, gate terminal 202, and drain connection 204. Each component is shown in each distinct perspective. The current moves within the FET in a channel, from source connection 200 to drain connection 204. Gate terminal 202 generates an electric field that controls the current. The FET controls the current flow from the source to the drain by affecting the size and shape of the channel created and influenced by voltage (or lack of voltage) applied across the gate and source terminals. This conductive channel is the path through which the current flows from source to drain.

Figure 3C:
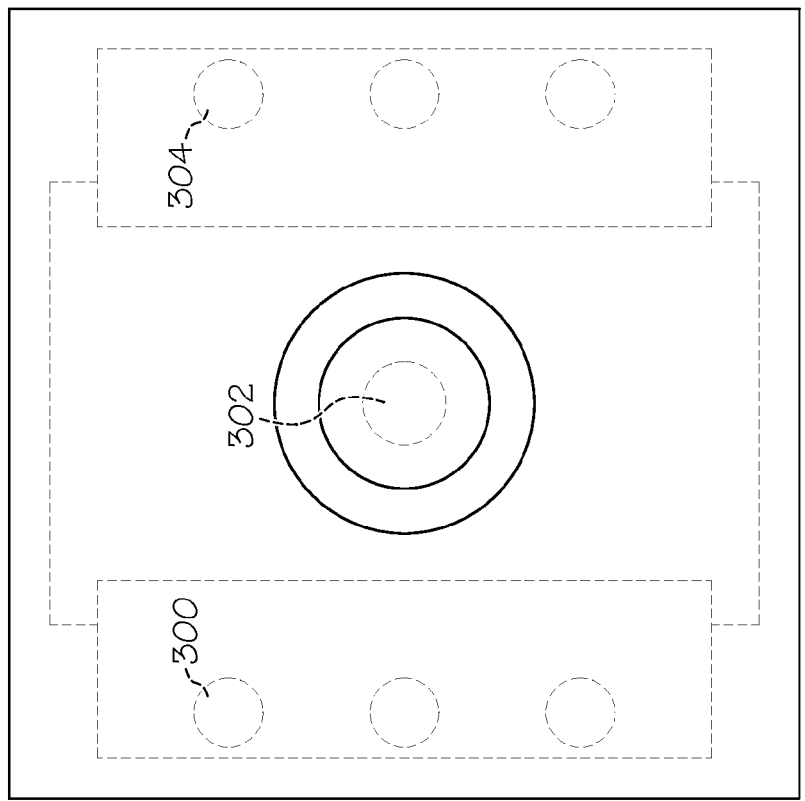
FIGS. 3A-C are another set of diagrams schematically illustrating three separate perspectives of a flexible switch cell.
Figure 3A:
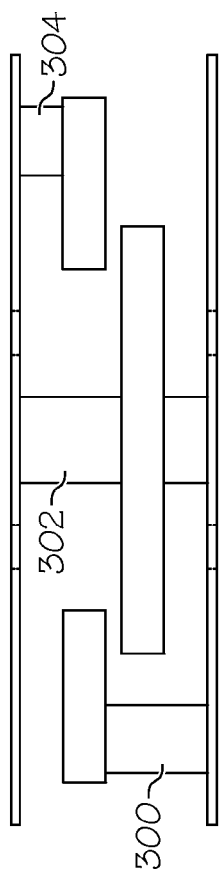
Figure 3B:
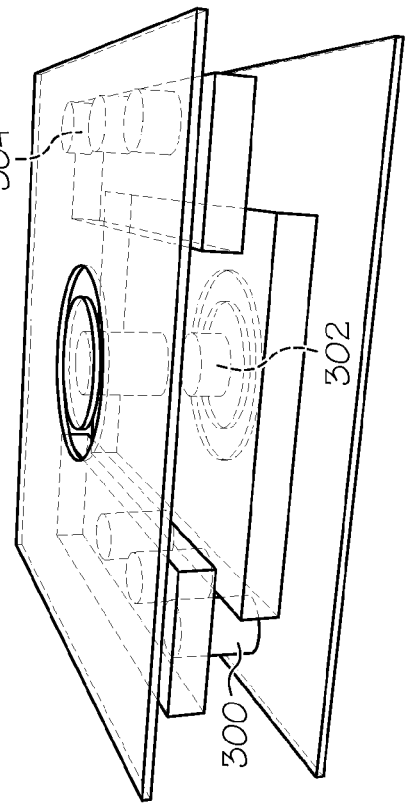

FIGS. 3A-C are another set of diagrams schematically illustrating three distinct perspectives of a flexible switch cell. The diagram depicts the following components: contact to bottom plate 300, contact to control 302, and contact to top plate 304. Each component is shown in each distinct perspective.

Figure 4:
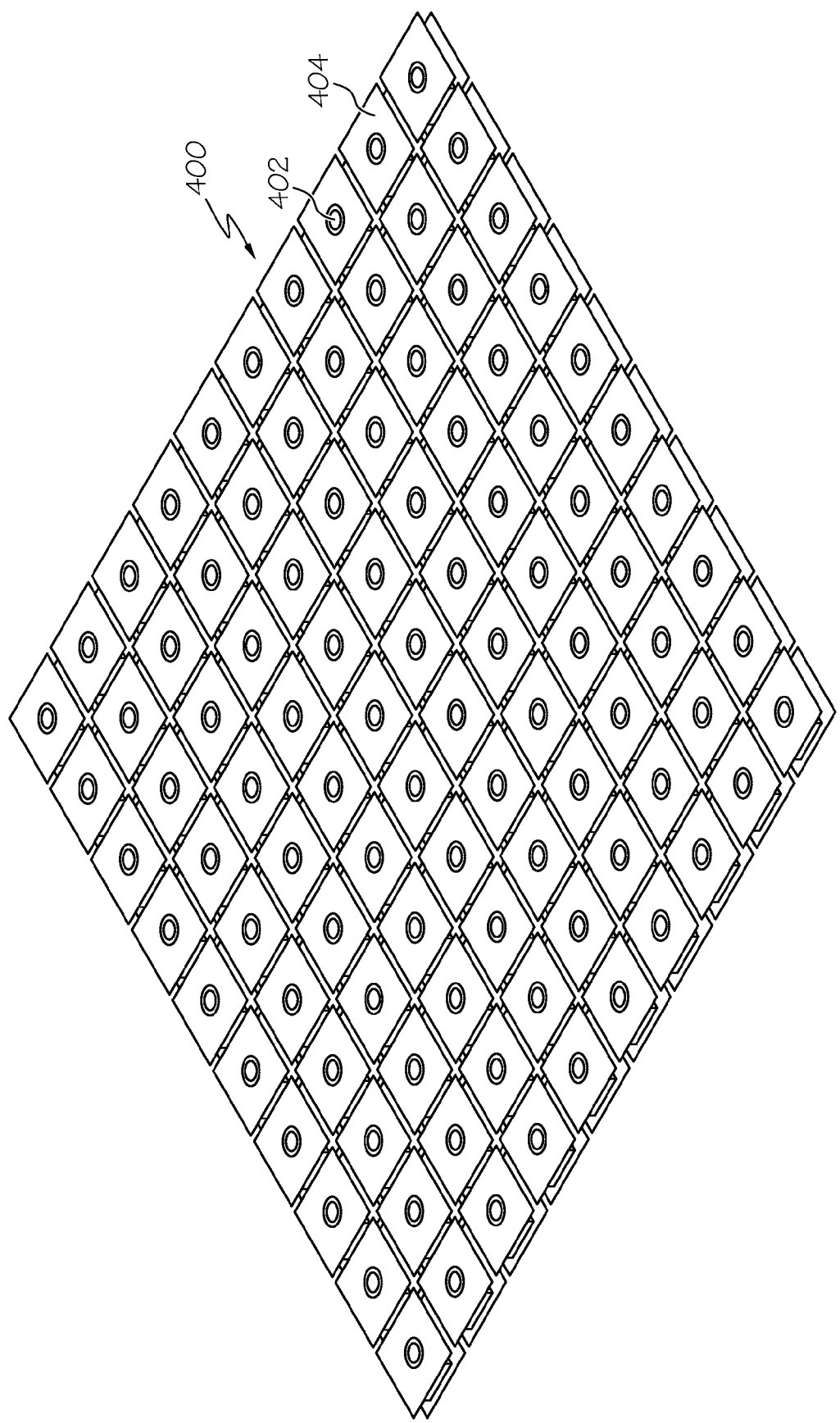
FIG. 4 is a diagram schematically illustrating a flexible switch plate.

FIG. 4 is a diagram schematically illustrating a flexible switch plane. The diagram depicts an array of flexible switch cells. Switch cell 400, control 402, and top plate 404 are highlighted. The diagram illustrates flexible switch cells aligned horizontally. Flexible switch cells aligned horizontally allow for cell-to-cell control connection.

Figure 5:
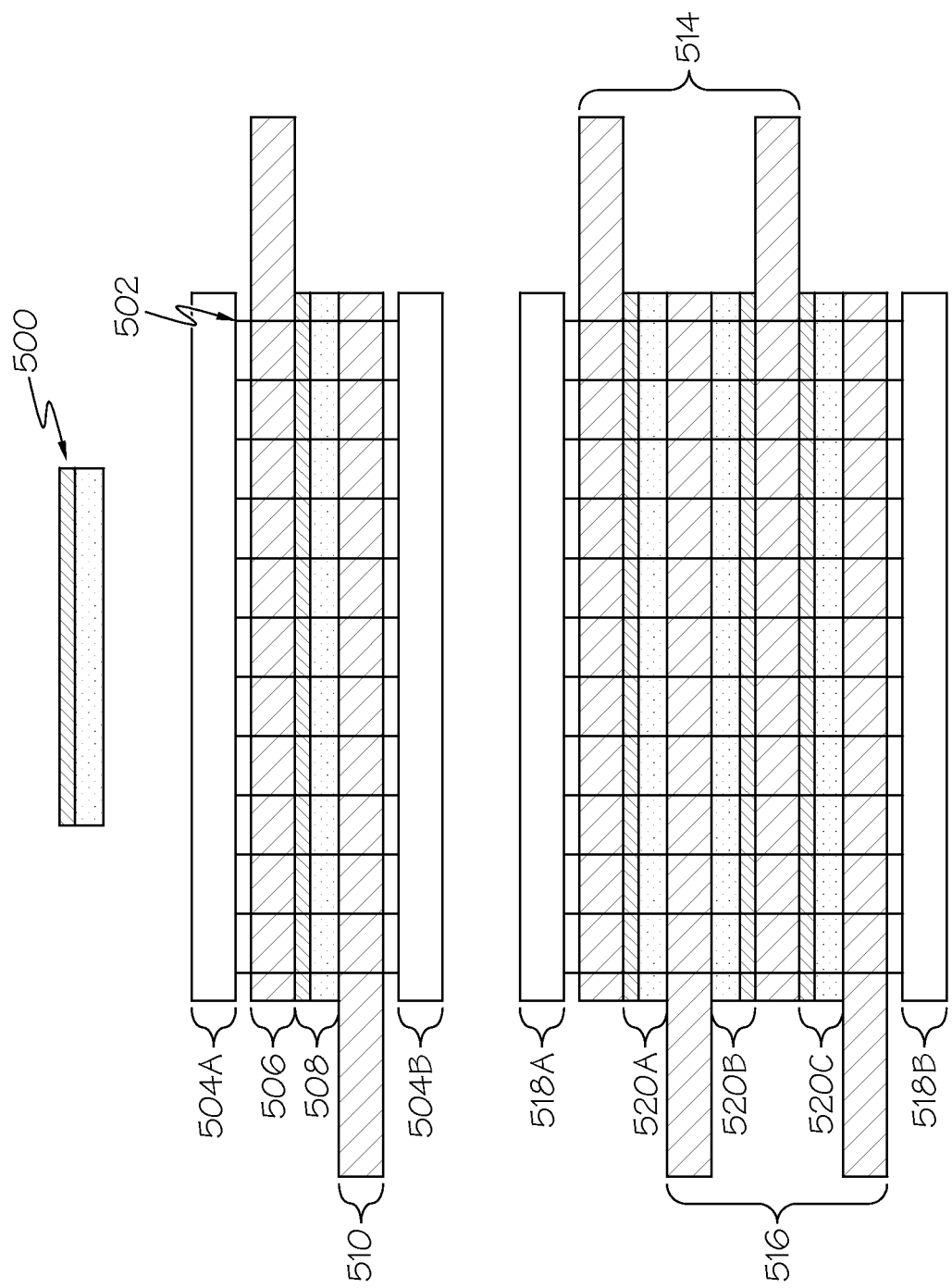
FIG. 5 is a diagram schematically illustrating switch plate integration and stacking.

FIG. 5 is a diagram schematically illustrating switch plate integration and stacking. The switch plate is composed of a PFE substrate. Two nodes and two controls are shown. Switch plate 508 separates node 506 and node 510. Controls 504A-B are shown having contact to switch control 502. Plate polarity 500 (if any) is shown. Multiple stacked switch plates 520A-C are shown in the following diagram. Switch plates are stacked using thru-film vias, bump bonds, or other suitable methods. Switch plates 520A-C separate node 514 and node 516. The first node is electrically isolated from the second node by the switch plate. Controls 518A-B are depicted in the outer layer. Each control is configured to provide a switch control signal to the switch.

Figure 6:
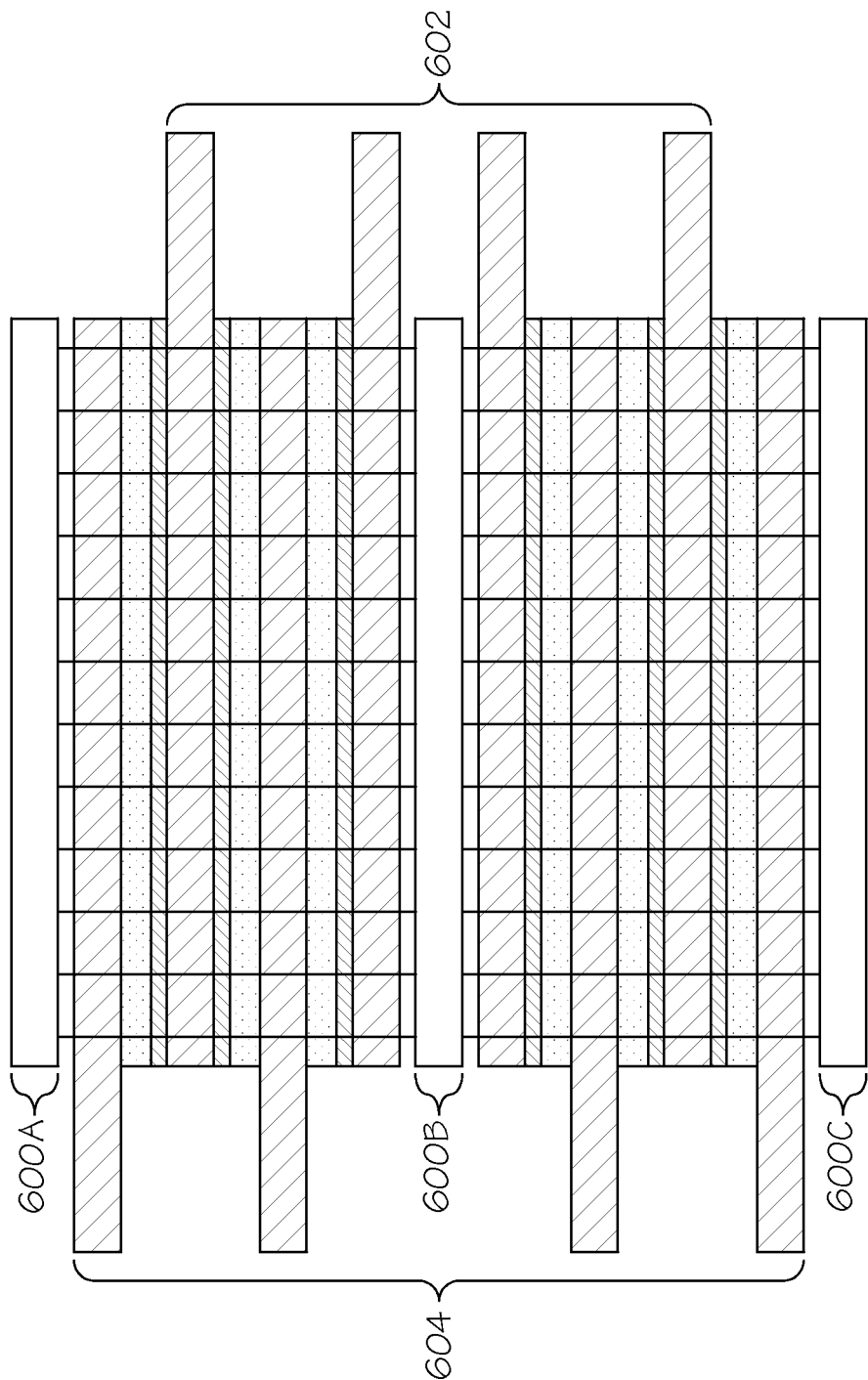
FIG. 6 is a diagram schematically illustrating switch plate integration with multiple controls.

FIG. 6 is a diagram schematically illustrating switch plate integration with multiple controls. Node 602 and node 604 are shown. The depicted stacked switch plates are shown with multiple controls 600A-C.

Figure 7:
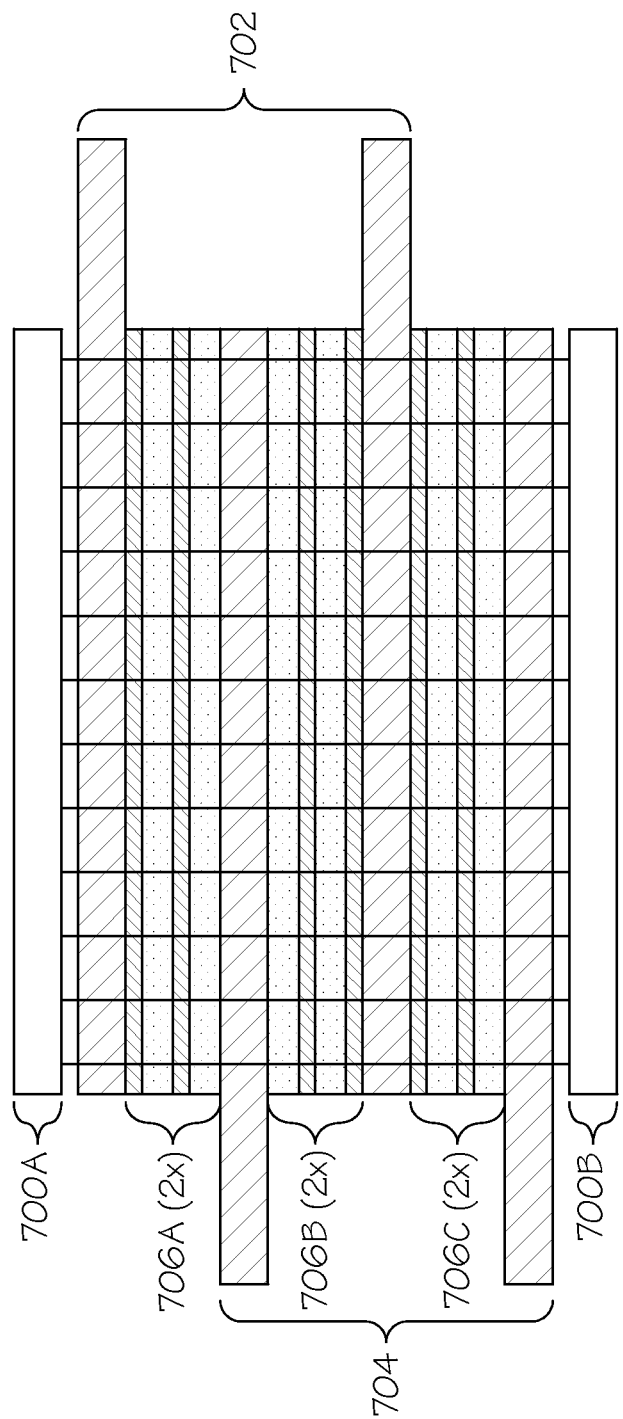
FIG. 7 is a diagram schematically illustrating switch plate integration with multiple plates between nodes.

FIG. 7 is a diagram schematically illustrating switch plate integration with multiple plates between nodes. In another embodiment, multiple switch plates are used between nodes. Node 702 and node 704 are separated by multiple plates. Switch plates 706A-C are shown between the nodes. Plates are double stacked between each node. Controls 700A-B are depicted in the outer layer.

Figure 8C:
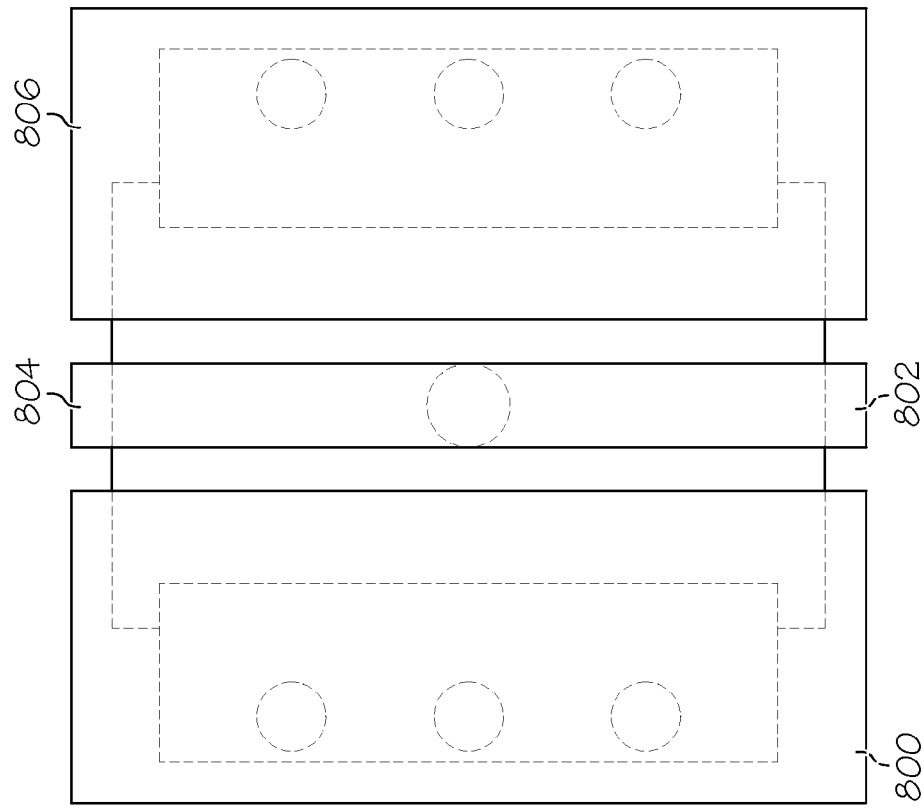
FIGS. 8A-C are diagrams schematically illustrating a flexible switch having alternate wiring.
Figure 8A:
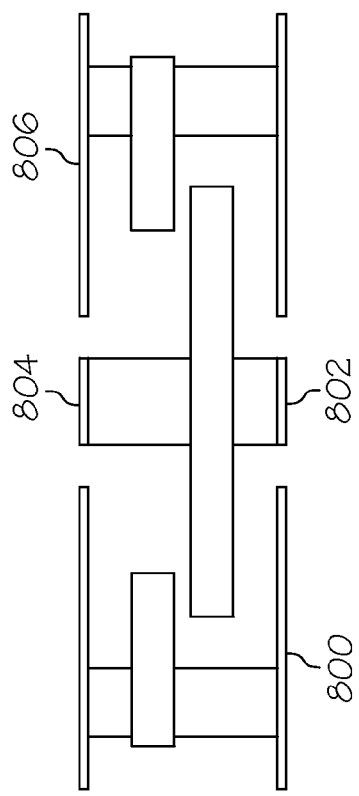
Figure 8B:
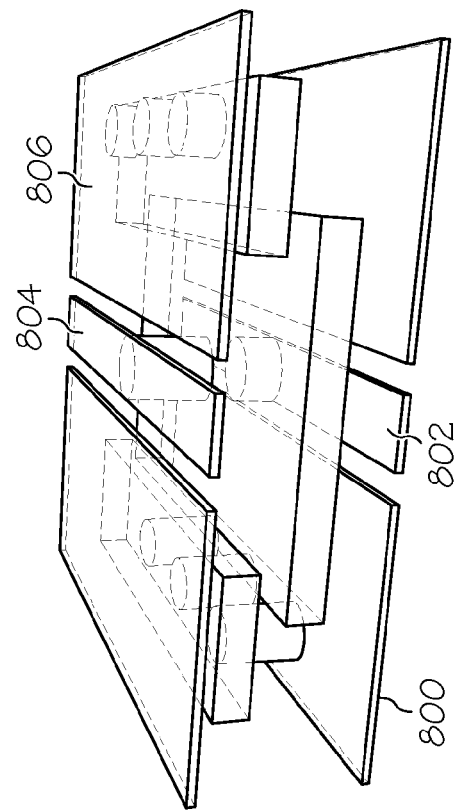

FIGS. 8A-C are diagrams schematically illustrating a flexible switch having alternate wiring from different perspectives. Source plate 800 and drain plate 806 are shown in each diagram, along with bottom control 802 and top control 804. Each component is shown in the diagrams but is depicted from various perspectives.

Figure 9C:
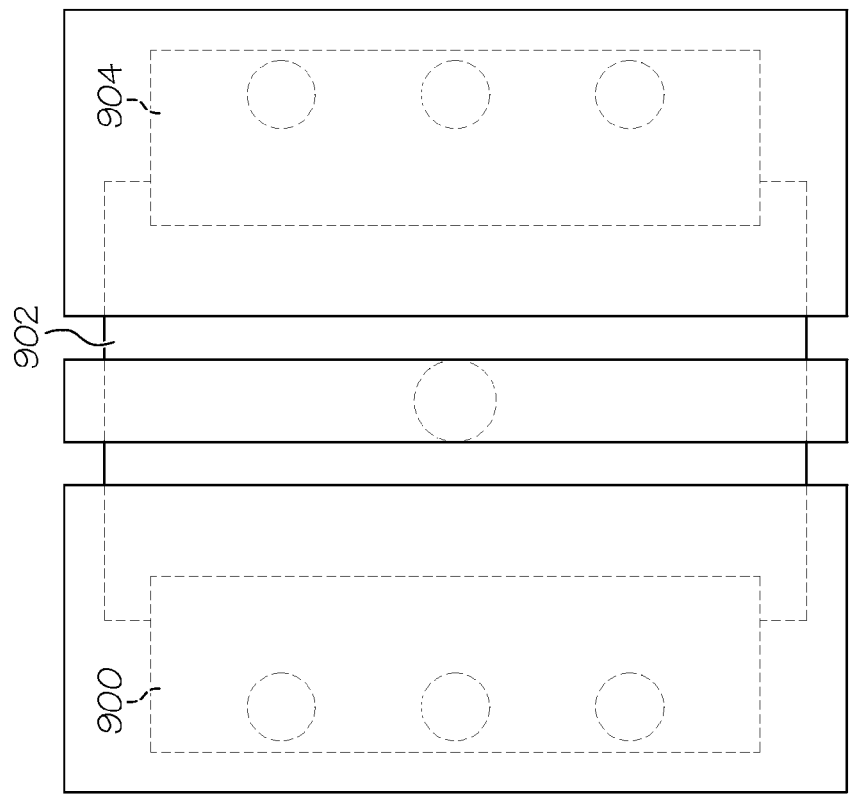
FIGS. 9A-C are another set of diagrams schematically illustrating a flexible switch having alternate wiring.
Figure 9A:
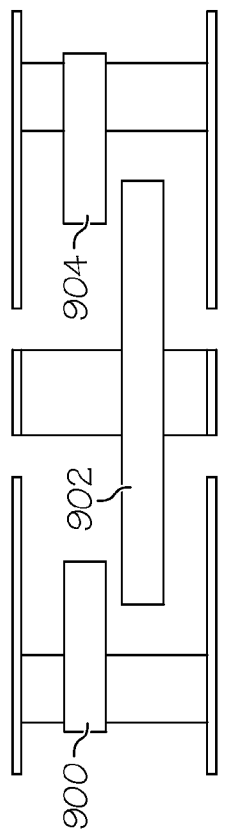
Figure 9B:
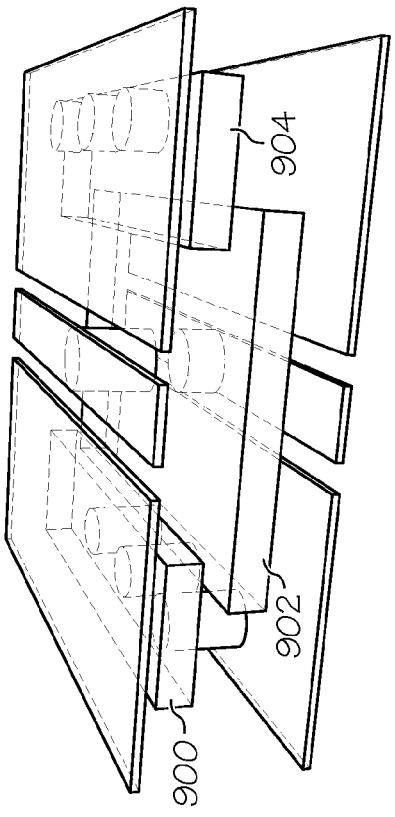

FIGS. 9A-C are another set of diagrams schematically illustrating a flexible switch having alternate wiring from different perspectives. Source 900 and drain 904 are shown in each diagram, along with gate 902. Each component is shown in the diagrams but is depicted from various perspectives.

Figure 10C:
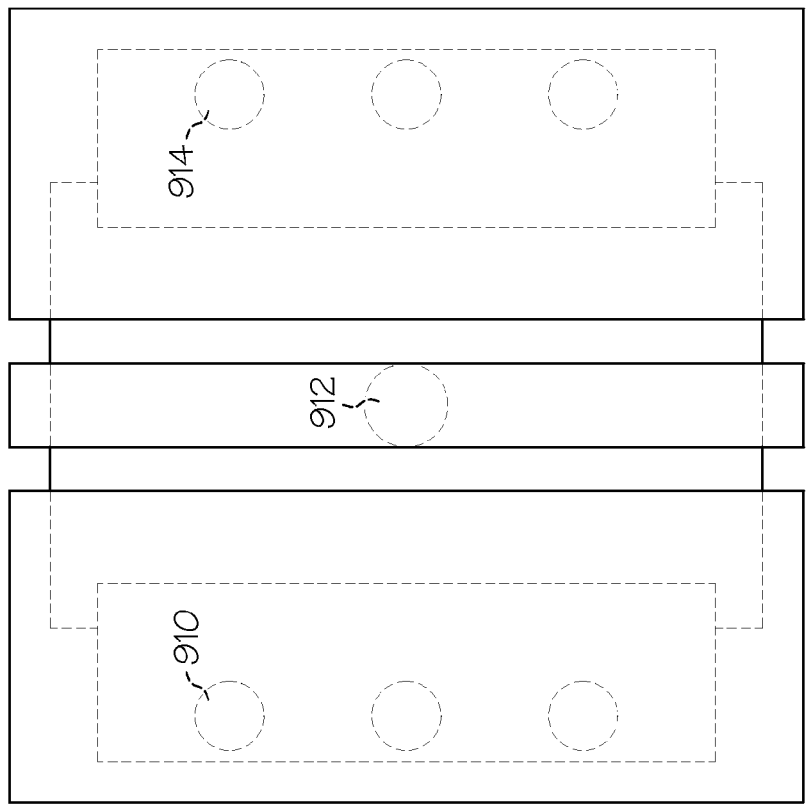
FIGS. 10A-C are another set of diagrams schematically illustrating a flexible switch having alternate wiring.
Figure 10A:
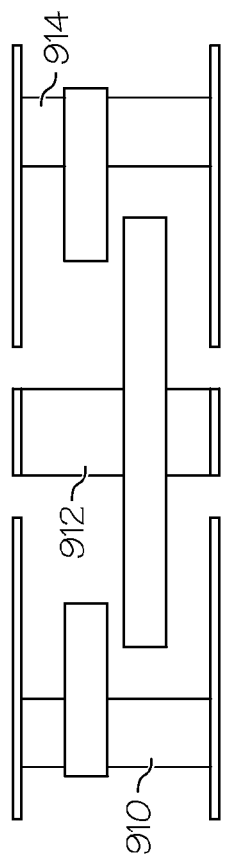
Figure 10B:
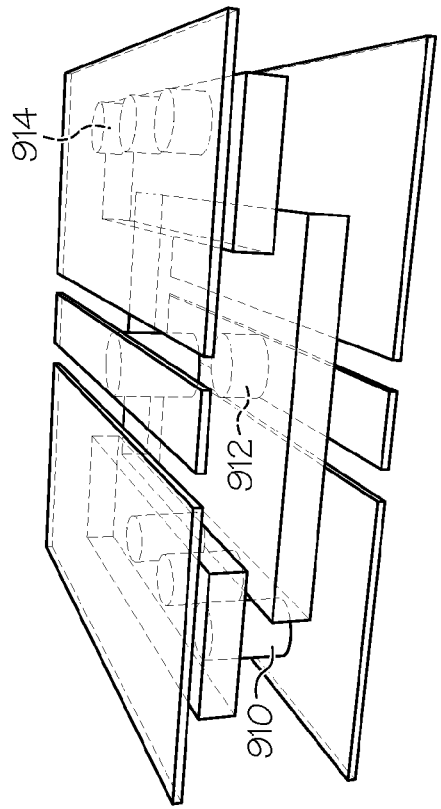

FIGS. 10A-C are another set of diagrams schematically illustrating different perspectives of a flexible switch having alternate wiring. Contact to bottom plate 910 and contact to top plate 914 are shown in each diagram, along with contact to control 912. Each component is shown in the diagrams but is depicted from various perspectives.

Figure 11:
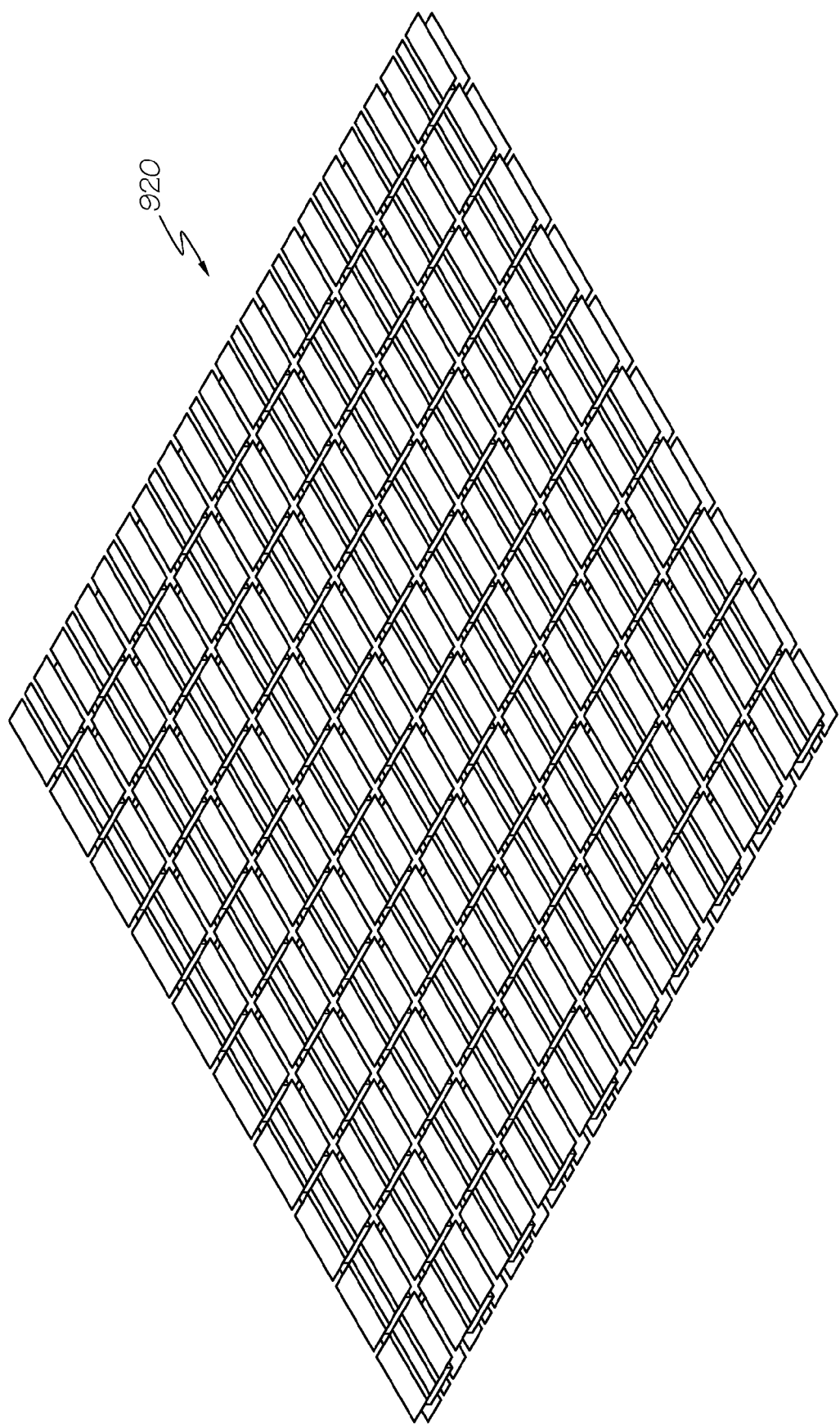
FIG. 11 is a diagram schematically illustrating the topical view of a flexible switch plate.

FIG. 11 is a diagram schematically illustrating the topical view of a flexible switch plate. Flexible switch plate 920 is shown as viewed from above. The connected, stacked switch plates are visible.

Figure 12:
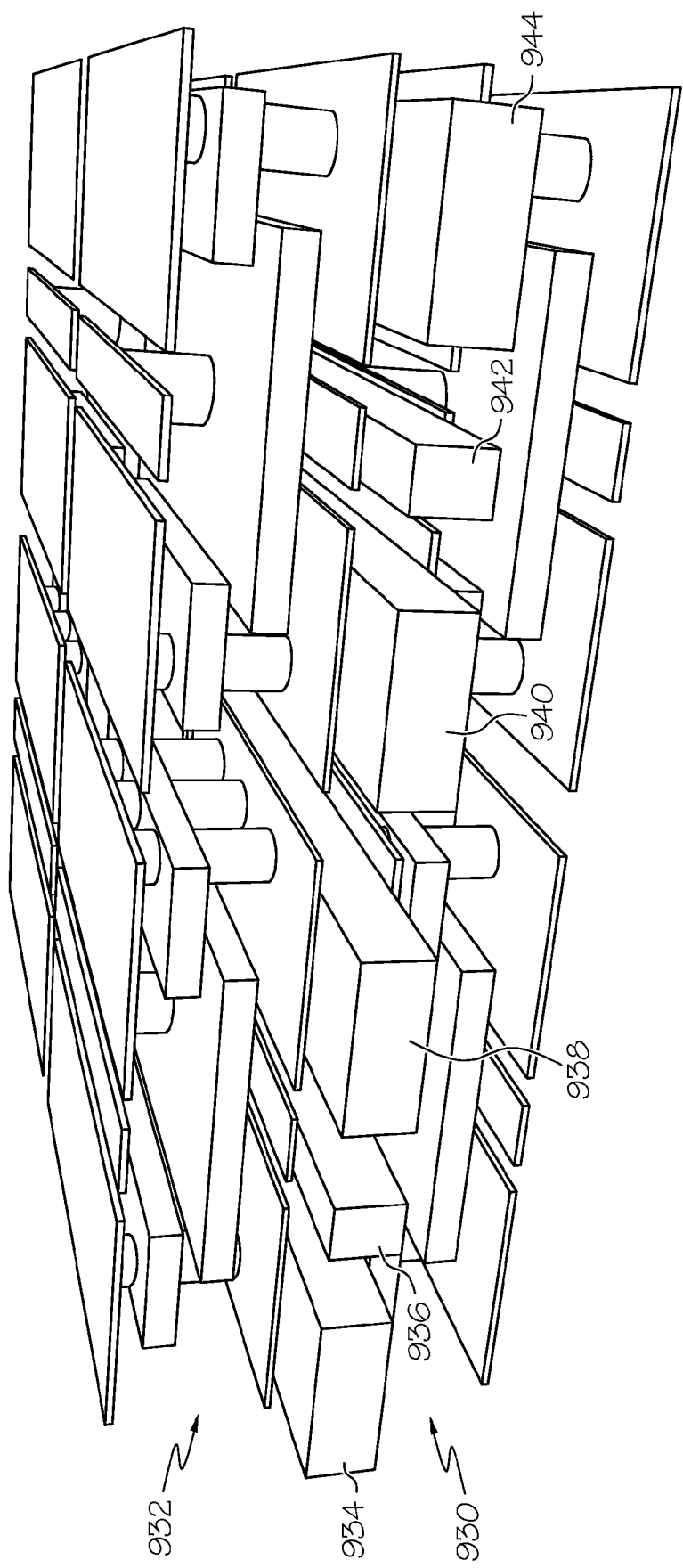
FIG. 12 is a diagram schematically illustrating flexible switch plate assembly.

FIG. 12 is a diagram schematically illustrating flexible switch plate assembly. Flexible plate assembly with two layers is depicted. Layer 930 and layer 932 are shown. Control 936 separates wire 934 and wire 938. Similarly, control 942 separates wire 940 and wire 944.

Figure 13:
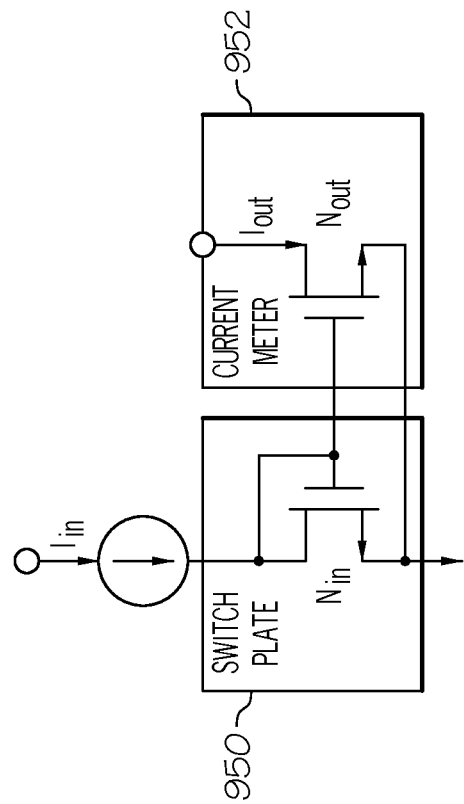
FIG. 13 is a diagram schematically illustrating current measurement with scaling-down current mirror.

FIG. 13 is a diagram schematically illustrating current measurement with scaling-down current mirror. Switch plate 950 and current meter 952 are shown. A current mirror is a circuit designed to copy a current through one active device by controlling the current in another active device of a circuit, keeping the output current constant regardless of loading. The current mirror circuit mirrors the current used in the line. To measure the current, the incoming current must first be scaled down. A small current is derived from a large current in order to measure the current. This is represented with the following expression: $I_{out}=I_{in}*N_{out}/N_{in}$.

Figure 14:
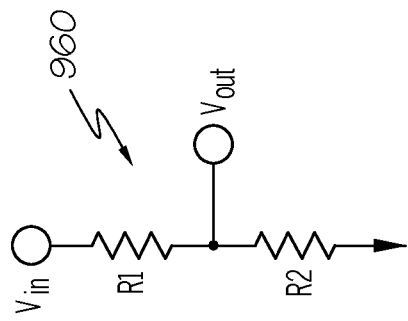
FIG. 14 is a diagram schematically illustrating voltage measurement with a voltage divider.

FIG. 14 is a diagram schematically illustrating voltage measurement with a voltage divider. Voltage divider 960 includes two resistors (R1 and R2). Resistors R1 and R2 lower the input to a low voltage for signal processing. Simple circuits may then be used to measure the voltage out ($V_{out}$) through voltage scaling. The following mathematical expression is used to measure the voltage out: $V_{out}=V_{in}*R_2/(R_1+R_2)$.

Figure 15:
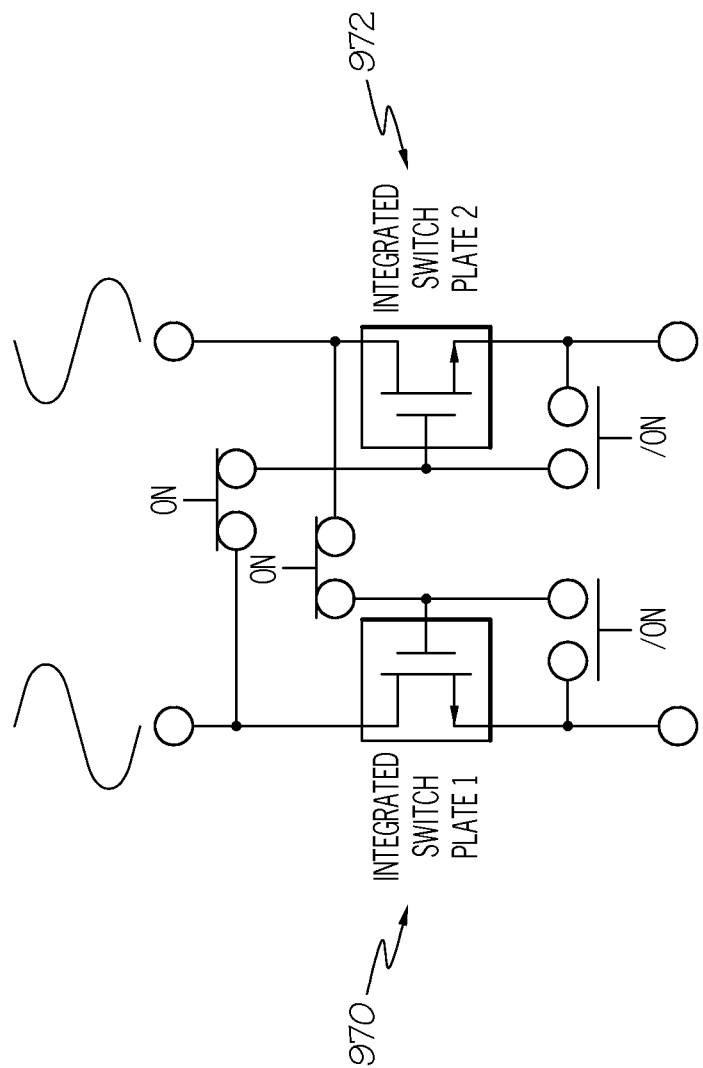
FIG. 15 is a diagram schematically illustrating an alternating current switch mechanism.

FIG. 15 is a diagram schematically illustrating an alternating current switch mechanism. Two integrated switch plates are shown (integrated switch plate 970 and integrated switch plate 972). Alternating current is shown flowing into each switch plate. An alternating current (AC) self-contained signal source is used for AC on/off control.

Figure 16:
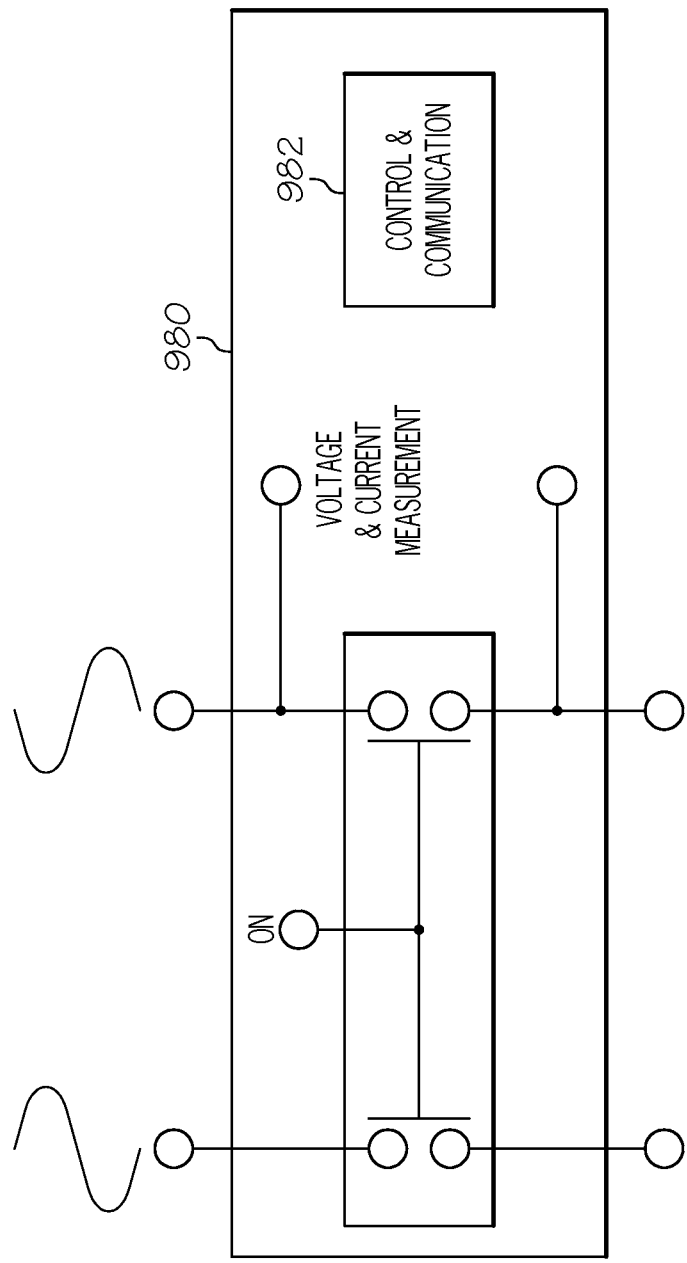
FIG. 16 is a system block diagram schematically illustrating voltage and current measurement.

FIG. 16 is a system block diagram schematically illustrating voltage and current measurement. Voltage and current measurement 980 is shown, along with control and communication 982. Voltage measurement is done using voltage scaling. Current measurement is done using a current mirror. These processes are controlled by control and communication 982.

Figure 17:
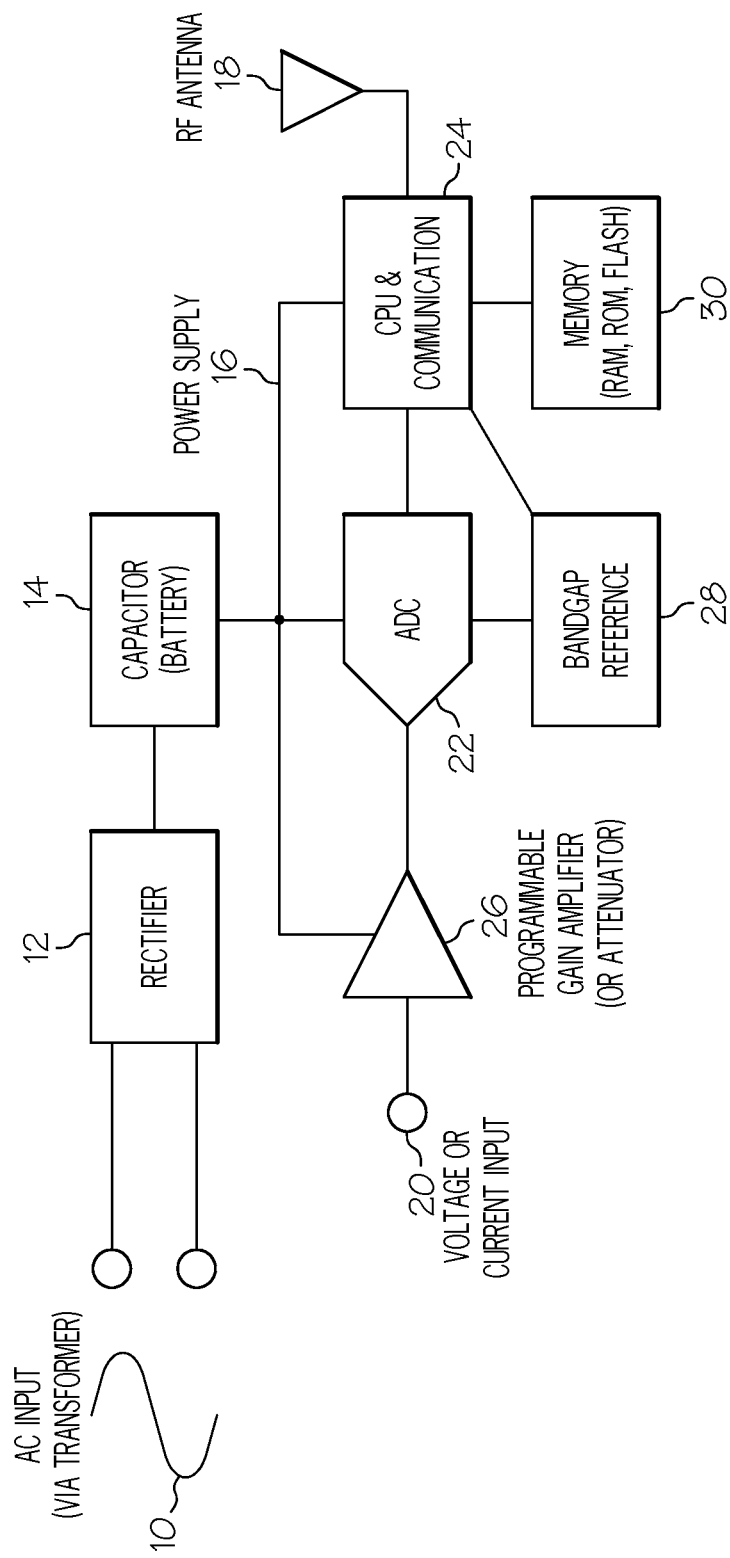
FIG. 17 is a system block diagram schematically illustrating various components according to an embodiment of the present invention.

FIG. 17 is a system block diagram schematically illustrating smart grid components according to an embodiment of the present invention. The stacked commodity switch solution may be used within smart grid applications. RFID antennas may be used as part of an energy-efficient smart grid solution. An RFID sensor unit design is shown. The RFID sensor unit includes AC input (via transformer) 10, rectifier 12, capacitor 14, power supply 16, voltage or current input 20, programmable gain amplifier (PGA) (or attenuator) 26, analog-to-digital converter (ADC) 22, bandgap reference 28, central processing unit (CPU) and communication 24, memory 30, and RF antenna 18. Each component will be discussed in detail below.

The input signal must be converted to a digital value that can be measured, stored, and transmitted. Analog-to-digital converter (ADC) 22 converts the input voltage of the induced current to a digital word. CPU and communication 24 controls ADC 22. ADC 22 provides an output that digitally represents the input voltage or current level. Systems with a wide dynamic range need a method of adjusting the input level to ADC 22. The incoming voltage may be too high or too low for ADC 22 to measure. PGA 26 provides gain/attenuation control to ensure the incoming signal is properly scaled. CPU and communication 24 controls PGA 26.

Voltage reference circuits are widely used in data converters, such as ADC 22. Voltage references are a key building block in data conversion systems. The reference voltage acts as a very precise analog 'meter stick' against which the incoming analog signal is compared in ADC 22. As such, a stable system reference is required for accurate and repeatable data conversion. Bandgap reference 28 provides the reference voltage for ADC 22 that is free from temperature effect and ripple voltage perturbation. CPU and communication 24 periodically checks the bandgap reference operation to ensure ADC 22 always has a valid reference value.

CPU and communication 24 has functions and responsibilities in addition to those discussed previously. CPU and communication 24 receives the value representing the induced current amplitude outputted by ADC 22, stores the measurement information in memory unit 30, and causes antenna 18 to transmit the measurement data over a radio frequency wave. Memory unit 30 is coupled to CPU and communication 24. CPU and communication 24 controls internal memory and nonvolatile memory to keep track of all necessary information discussed herein. Memory unit 30 includes random access memory (RAM), ROM, and flash memory for data processing, firmware, and non-volatile rewriteable storage. RAM provides space for data being accessed by CPU and communication 24. ROM is used to distribute firmware. Firmware denotes the fixed programs and/or data structures used to control the various components of the RFID sensor unit.

Measurement values are stored in non-volatile rewriteable storage. Measurement values may be stored with a timestamp in memory unit 30, since it might be necessary to flush out data after a predefined amount of time has elapsed. Also, situations may arise when it is necessary to relay the data to other RFID sensor units within the same network in order to get it closer to its final destination, which is the data collection point (i.e., the RFID reader).

While the exemplary embodiments have been shown and described herein, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. An electronic switch cell, comprising:
   a flexible film substrate having a top plate, a top control, a bottom plate, and a bottom control; and
   a field-effect transistor (FET) positioned between the top plate and the bottom plate, wherein components of the FET are operatively affixed to the top plate, the bottom plate, the top control and the bottom control.

2. The electronic switch cell of claim 1, wherein the FET includes a source that is operatively affixed to the bottom plate, a gate that is operatively affixed to the top control and to the bottom control, and a drain terminal that is operatively affixed to the top plate.

3. The electronic switch cell of claim 1, the flexible film substrate further comprising a substantially parallel plate structure in which the top plate is substantially parallel to the bottom plate.

4. An electronic switch system comprising a plurality of stackable electronic switch cells that are operatively coupled with each other, each electronic switch cell comprising:
   a flexible film substrate having a top plate, a top control, a bottom plate, and a bottom control; and
   a field-effect transistor (FET) positioned between the top plate and the bottom plate, wherein components of the FET are operatively affixed to the top plate, the bottom plate, the top control and the bottom control.

5. The electronic switch system of claim 4, wherein the FET includes a source that is operatively affixed to the bottom plate, a gate that is operatively affixed to the top control and to the bottom control, and a drain terminal that is operatively affixed to the top plate.

6. The electronic switch system of claim 4, the flexible film substrate further comprising a substantially parallel plate structure in which the top plate is substantially parallel to the bottom plate.

7. The electronic switch system of claim 4, wherein the plurality of electronic switch cells are stacked using thru-film vias (TFV).

8. The electronic switch system of claim 4, wherein the plurality of electronic switch cells are stacked using bump bonds.

9. A method for assembling an electronic switch system, comprising:
   providing a plurality of stackable electronic switch cells, each switch cell comprising:
      a flexible film substrate having a top plate, a top control, a bottom plate, and a bottom control; and
      a field-effect transistor (FET) positioned between the top plate and the bottom plate, wherein components of the FET are operatively affixed to the top plate, the bottom plate, the top control and the bottom control; and
   stacking the provided plurality of switch cells using at least one of thru-film vias and bump bonds.

10. The method of claim 9, wherein the FET includes a source that is operatively affixed to the bottom plate, a gate that is operatively affixed to the top control and to the bottom control, and a drain terminal that is operatively affixed to the top plate.

11. The method of claim 9, further comprising applying a current to the flexible film substrate, the FET controlling current flow within the electronic switch based on the applied current the flexible film substrate comprising a substantially parallel plate structure in which the top plate is substantially parallel to the bottom plate.

12. The method of claim 9, further comprising coupling each of the stacked electronic switch cells coupled with a voltage divider having a first resistor and a second resistor; and
   measuring power consumption with the each of the electronic switches using voltage scaling.

* * * * *